United States Patent
Baker et al.

(10) Patent No.: US 6,774,690 B2
(45) Date of Patent: Aug. 10, 2004

(54) DIGITAL DUAL-LOOP DLL DESIGN USING COARSE AND FINE LOOPS

(75) Inventors: R. Jacob Baker, Meridian, ID (US); Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/208,060

(22) Filed: Jul. 30, 2002

(65) Prior Publication Data

US 2002/0180501 A1 Dec. 5, 2002

Related U.S. Application Data

(63) Continuation of application No. 09/585,035, filed on Jun. 1, 2000, now Pat. No. 6,445,231.

(51) Int. Cl.[7] .............................. H03L 7/06; H03D 3/24
(52) U.S. Cl. ...................... 327/158; 327/156; 327/278; 375/376
(58) Field of Search ................................. 327/156, 158, 327/264, 263, 270, 3, 12, 278, 291, 147; 375/376, 374

(56) References Cited

U.S. PATENT DOCUMENTS

| | | | |
|---|---|---|---|
| 5,109,394 A | 4/1992 | Hjerpe et al. | 375/119 |
| 5,355,037 A | 10/1994 | Andresen et al. | 307/602 |
| 5,604,775 A | 2/1997 | Saitoh et al. | 375/376 |
| 5,744,991 A | 4/1998 | Jefferson et al. | 327/158 |
| 5,963,069 A * | 10/1999 | Jefferson et al. | 327/158 |
| 6,049,239 A | 4/2000 | Eto et al. | 327/158 |
| 6,069,506 A * | 5/2000 | Miller, Jr. et al. | 327/156 |
| 6,075,415 A * | 6/2000 | Milton et al. | 331/25 |
| 6,101,197 A | 8/2000 | Keeth et al. | 370/517 |
| 6,130,552 A | 10/2000 | Jefferson et al. | 326/39 |
| 6,297,680 B1 | 10/2001 | Kondo | 327/278 |
| 6,445,231 B1 * | 9/2002 | Baker et al. | 327/158 |

* cited by examiner

Primary Examiner—Dinh T. Le
(74) Attorney, Agent, or Firm—Schwegman, Lundberg, Woessner & Kluth, P.A.

(57) ABSTRACT

A dual-loop digital delay locked loop (DLL) is provided. The DLL includes a coarse loop to produce a first delayed signal and provides a wide frequency lock range. The DLL further includes a fine loop connected to the coarse loop to produce a second delayed signal and provides a tight locking. This dual-loop architecture can provide robust operation and tight synchronization over a wide range of delay variations.

47 Claims, 20 Drawing Sheets

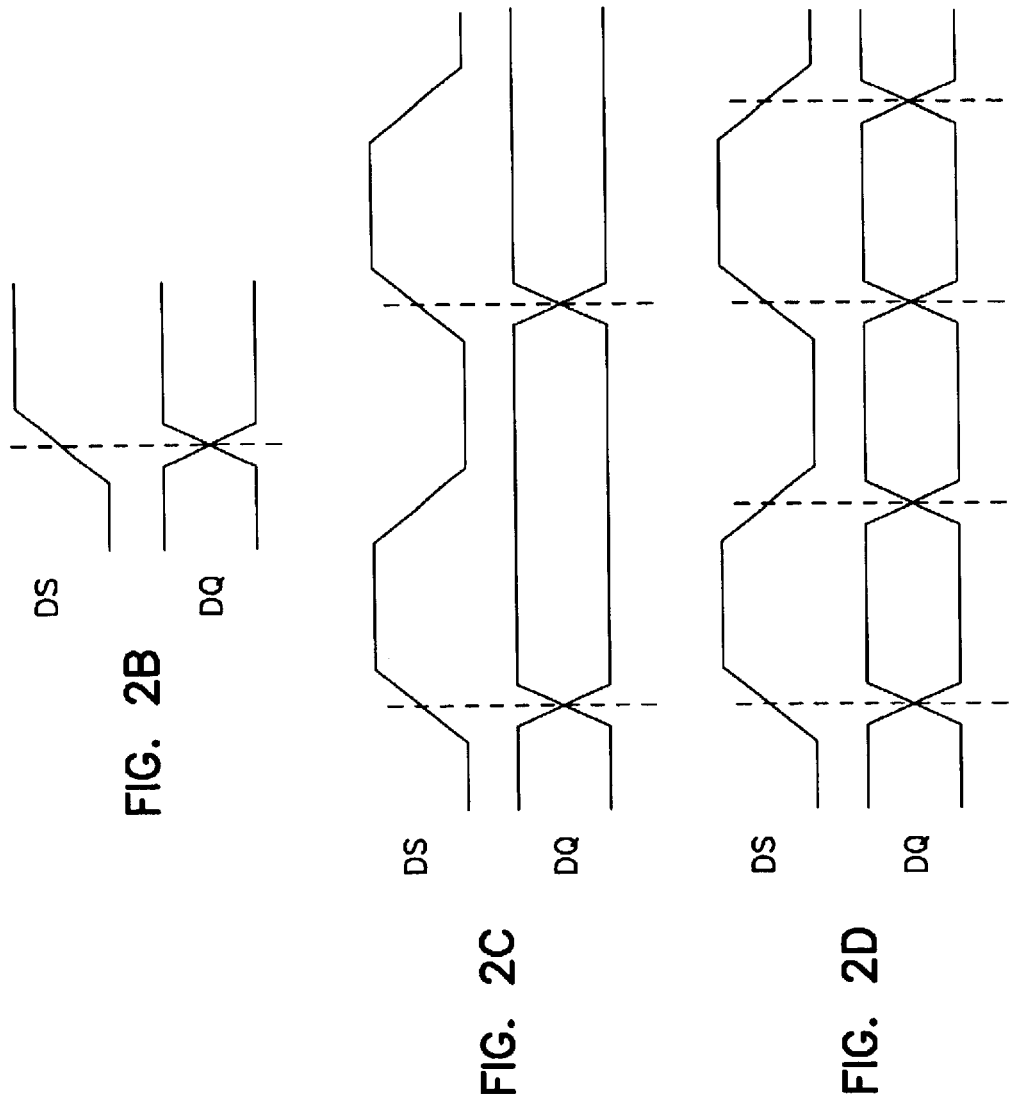

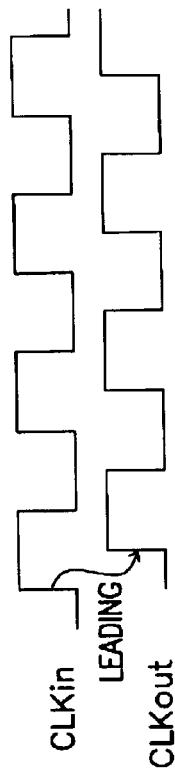
FIG. 4A
FIG. 4B
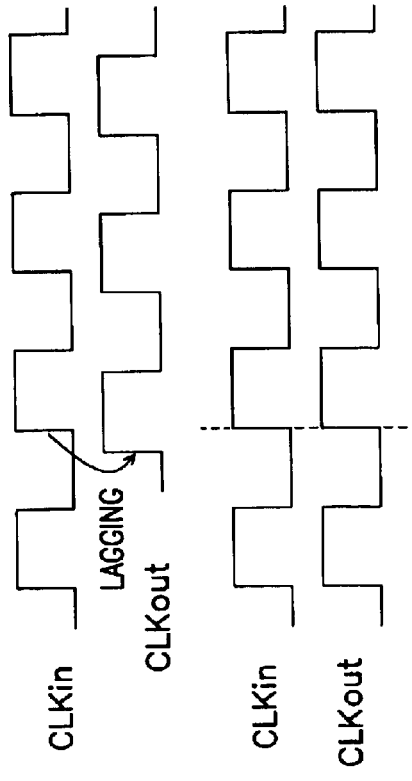
FIG. 4C
FIG. 4D

DIGITAL DUAL-LOOP DLL DESIGN USING COARSE AND FINE LOOPS

RELATED APPLICATION

This application is a Continuation of U.S. Ser. No. 09/585,035 filed on Jun. 1, 2000, which is incorporated herein by reference.

TECHNICAL FIELD OF THE INVENTION

The present invention relates generally to integrated circuits and in particular to digital delay locked loops in semiconductor memory devices.

BACKGROUND OF THE INVENTION

Semiconductor memory devices such as dynamic random access memory (DRAM) devices are widely used to store data in computers and electronic products. A DRAM device comprises a plurality of memory cells for storing data. A data is stored or written into a DRAM device by a write operation. The stored data is read from the DRAM device by a read operation.

During a read operation, a memory cell is accessed, the stored data is read from the memory cell and transmitted to an output pad. The data at the output pad is represented as an electrical signal or a data signal (DQ). In order to determine a time window in which a valid data is present at the output pad, a data strobe signal (DS) is designed to track or lock to the data signal. Locking, or synchronizing, the DS and DQ signals ensures the integrity of the data, which is especially essential in a high speed DRAM device.

When the DQ signal propagates from the memory cell to the output pad, a time delay occurs. It is difficult to predict the time delay of the DQ signal because of variations in temperature, supply voltage or other process variations within the DRAM device. Therefore locking the DS signal to the DQ signal requires careful timing calculation and reliable circuit design.

Different DRAM devices use different timing calculations and techniques for designing a circuit to lock the DS signal to the DQ signal. Some DRAM devices use analog circuits such as charge pump, loop filter and voltage-controlled delay line while other use a mix of analog and digital circuits for performing the necessary timing calculations. However, the inclusion of analog circuits often make it hard to scale for other process and applications and are unstable due to the variations in process, supply voltage and temperature. Furthermore, these analog implementations require complex tuning after the production in order to get a tight locking.

Thus, there is a need for a new technique which can more efficiently lock the strobe signal DS to the data signal DQ over wide range of frequency in integrated circuits. It is further desired that such circuits and method are portable and easy to scale for different process and applications without requiring post production tuning.

SUMMARY OF THE INVENTION

The problem associated with DLL and other problems are addressed by the present in invention and will be understood by reading the following disclosure. A digital dual-loop delay locked loop (DLL) is provided which has a wide frequency lock range and tight locking without post production tunning. The digital dual-loop DLL is suitable for uses in a DRAM device to lock a strobe signal DS to a data signal.

In one embodiment, a dual-loop digital DLL is provided. The DLL includes a coarse loop to produce a first delayed signal which is coarsely locked to the input signal. The coarse loop has a delay range to provide a wide frequency lock range. The DLL further includes a fine loop connected to the coarse loop to produce a second delayed signal. The fine loop has a delay range which is substantially smaller than that of the coarse loop to provide a tight locking.

In yet another embodiment, a method for synchronizing two signals is described. The method includes applying an amount of delay to an input signal at a coarse loop to produce a first delayed signal. The method also includes applying an amount of small delay to the first delayed signal at a fine loop to produce an output signal. The method further includes comparing the output signal and the input signal and adjusting the delay of both loops until the output signal and the input signal are tightly synchronized.

BRIEF DESCRIPTION OF THE DRAWINGS

FIGS. 2B–D are timing diagrams illustrating signal relationships of the portion of the memory device shown in FIG. 2A.

FIGS. 4A–D are timing diagrams showing signal relationships of the DLL of FIG. 3A.

DETAILED DESCRIPTION OF THE INVENTION

The following detailed description of the embodiments of the invention refers to the accompanying drawings which form a part hereof, and shows by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
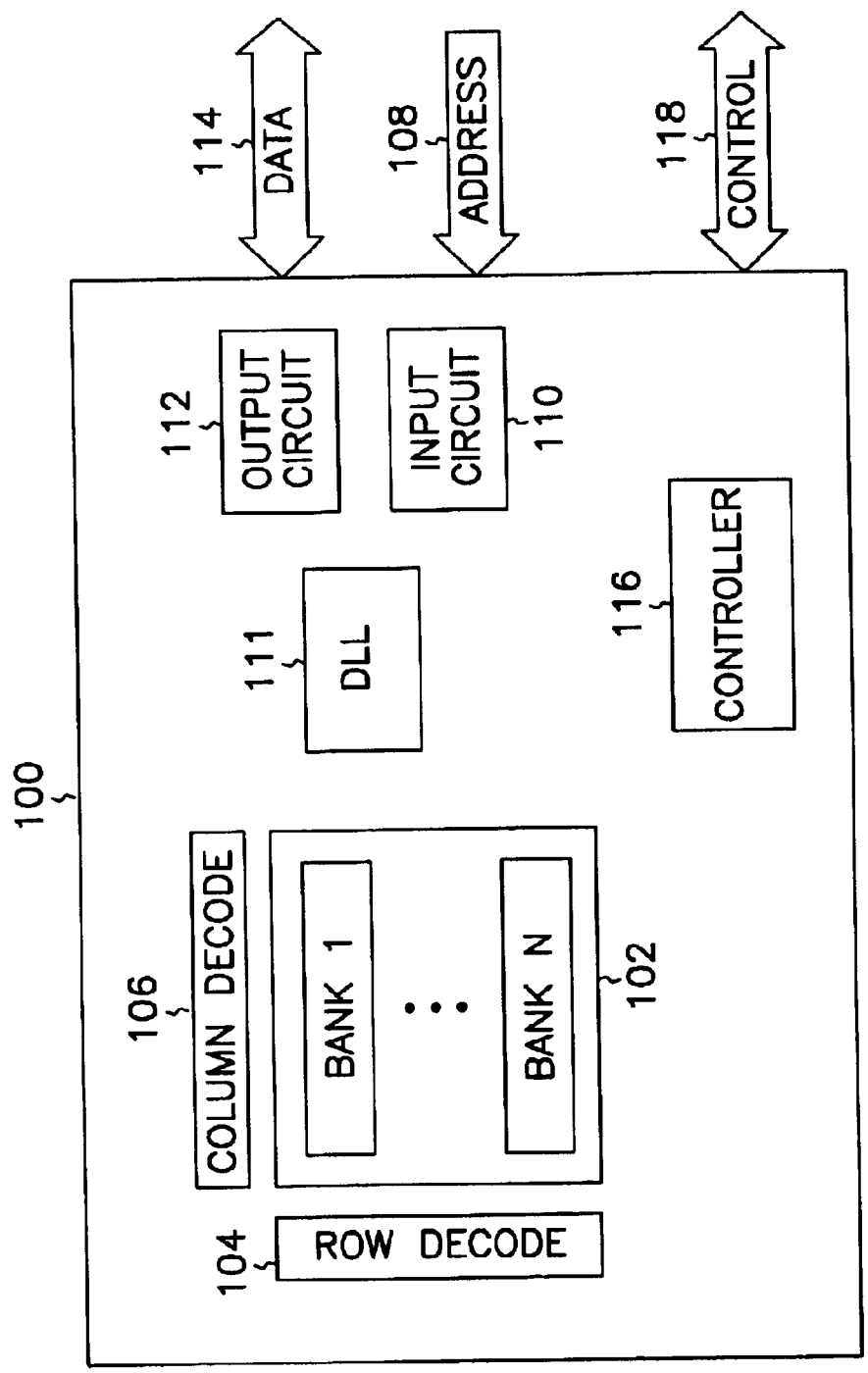
FIG. 1 illustrates an embodiment of a memory device of the invention.

FIG. 1 illustrates a memory device 100 of the invention. In one embodiment, memory device 100 includes, by way of example and not limitation, a synchronous dynamic random access memory device (SDRAM). As shown in FIG. 1, memory device 100 includes a main memory 102. Main memory 102 typically includes dynamic random access memory (DRAM) devices which include one or more memory banks, indicated by BANK 1–N. Each of the memory banks BANK 1–N includes a plurality of memory cells arranged in rows and columns. Row decode 104 and column decode 106 access the rows and columns in response to an address, provided on address bus 108 (ADDRESS) by an external controller (not shown), such as a microprocessor. An input circuit 110 and an output circuit 112 connect to a data bus 114 (DATA) for bi-directional data communication with main memory 102. A memory controller 116 controls data communication between the memory 100 and external devices by responding to an input clock signal (CLK) and control signals provided on control lines 118 (CONTROL). The control signals include, but are not limited to, Chip Select (CS*), Row Access Strobe (RAS*), Column Access Strobe (CAS*), Write Enable (WE*), and Clock Enable (CKE).

As shown in FIG. 1, a delay locked loop (DLL) 111, formed according to the teaching of the present invention, connects to input circuit 110 and output circuit 112 for performing a timing adjustment, such as skew elimination or clock synchronization between two clock signals. According to the teaching of the present invention DLL 111 is a digital dual-loop DLL which has the capability to provide a skew elimination over a wide range of frequencies with very tight locking. Those skilled in the art will readily recognize that the DRAM device 100 of FIG. 1 is simplified to illustrate the present invention and is not intended to be a detailed description of all of the features of a DRAM device.

Figure 2A:
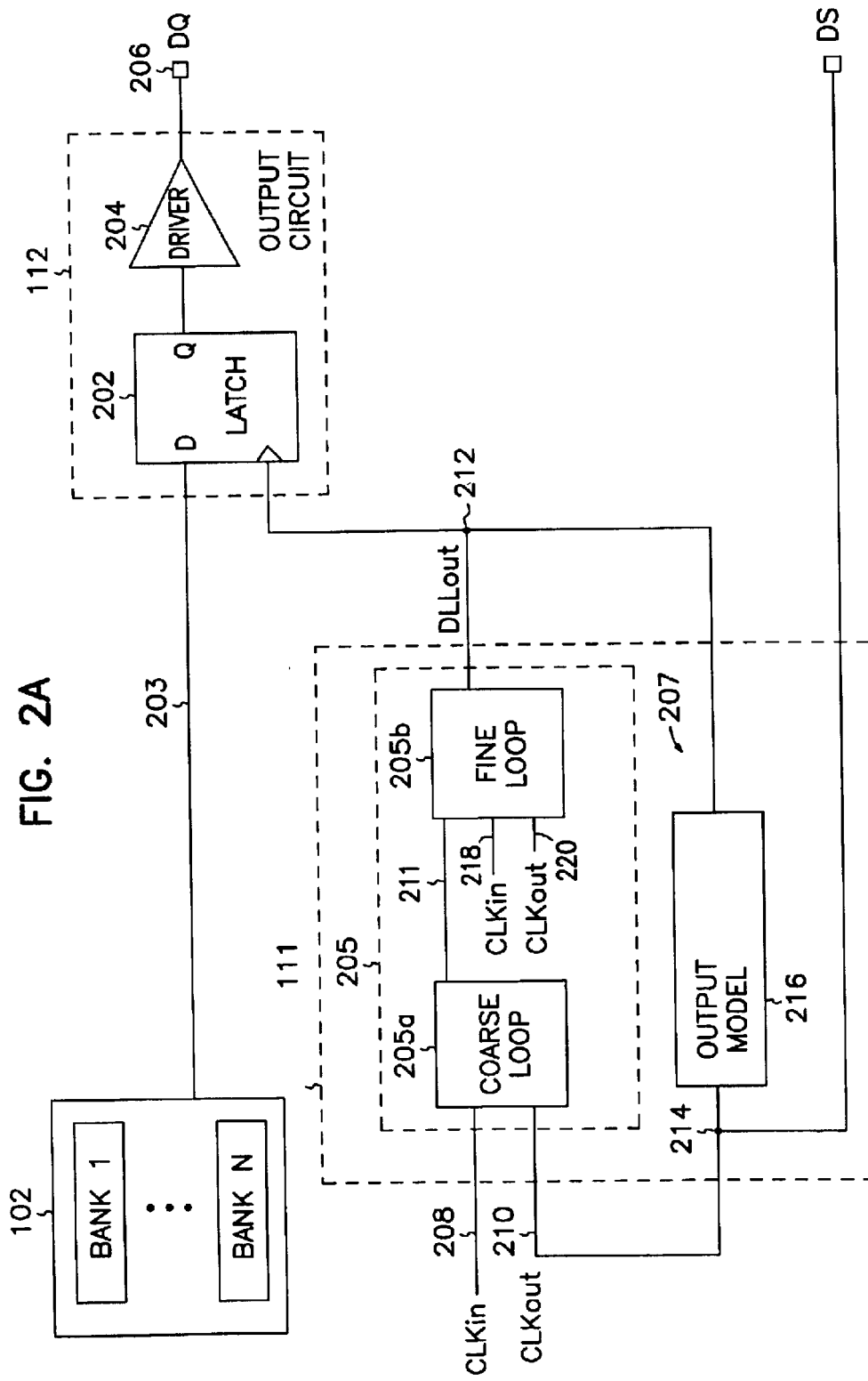
FIG. 2A shows a block diagram illustrating a portion of the memory device of FIG. 1.

FIG. 2A is a block diagram illustrating a portion of memory device 100 of FIG. 1 including main memory 102, dual-loop DLL 111, and output circuit 112. Output circuit 112 includes an output latch 202 connected to an output driver 204. Output latch 202 is connected to main memory 102 via connection line 203. Output driver 204 is connected to an output pad 206 which provides a data output signal DQ. DLL 111 includes a forward path 205 having a first loop or coarse loop 205a connected to a second loop or fine loop 205b. In one embodiment, coarse loop 205a has a range up to 20 ns (nanosecond) to provide a wide frequency lock range. Fine loop 205b has a delay range from about 1 to 1.2 ns to provide a tight locking. Coarse loop 205a has input nodes 208 and 210 and an output node 211. Input node 208 receives an input clock signal CLKin. Input node 210 receives a feedback clock signal CLKout. And a first output node 211 provides a first delayed signal or coarse loop output signal Cout. Fine loop 205b receives Cout signal of coarse loop 205a at node 211, CLKin signal at node 218 and CLKout signal at node 220. Fine loop 205b outputs a second delayed signal DLLout at second output node or DLL output node 212. Thus DLLout signal is an output signal of DLL 111 which has dual loops indicated by coarse loop 205a and fine loop 205b. CLKout is a feedback signal provided at node 214 of a feedback path 207. Feedback path 207 includes a delay model circuit 216. Delay model circuit 216 is connected to receive DLLout signal at node 212 and providing CLKout signal at node 214. Delay model circuit 216 is identical to output circuit 112. In other words, delay model circuit 216 can be constructed to have a delay time equal to a delay time of output circuit 112. In addition, at node 214, a data strobe signal DS is provided. Thus, DS and CLKout signal are the same signal. When DLL 111 is locked during a normal operation of the memory device, DS and DQ signals are synchronized.

FIG. 2B shows timing diagram of DS and DQ signals when DLL 111 of FIG. 2A is locked. As shown in FIG. 2A, memory device 100 provides a data output signal DQ. The DQ can move around due to process variations within the device. Without DLL 111, data strobe signal DS may not latch the correct data, or to meet the setup or hold time requirement and the operating speed of the memory has to be slowed down. DLL 111 is designed to dynamically tracks the process variations and enables DS signal to correctly latch DQ signal or ensures that DQ and DS signals are synchronized. As shown in FIG. 2B, DS signal is tightly synchronized with the DQ signal. The synchronization is achieved by DLL 111, which automatically adjusts to the delay variations of memory device 100.

FIGS. 2C–D shows timing diagram of DS and DQ signals during a memory access operation of memory device 100. During a memory access such as a read operation, controller 116 (FIG. 1) receives a combination of control signals via control lines 118 indicating a read operation. Row decode 104 and column decode 106 access a memory cell using an address provided by address bus 108. The accessed memory cell outputs a data stored in the memory cell via line 203 to output circuit 112. Output circuit 112 latches and drives the data out to output pad 206. At output pad 206, the data is represented as a DQ signal. To ensure a high performance of the memory device, DS signal must be locked to DQ signal. DLL 111 generates synchronized clock signal DLLout to latch the data and locks DS signal to DQ signal. As shown in the timing diagram of FIG. 2B, at the rising edge of DS signal, DQ signal is locked to or substantially synchronize with DQ signal. According to the teaching of the present invention, DLL 111 can be used in a double data rate DRAM device where data occurs on both rising and fall edge of a clock signal with little duty-cycle distortion. In FIG. 2C, data (DQ signal) occurs at the rising and falling edge of DS signal. To achieve the locking, DLL 111 compares CLKin and CLKout signals and adjusts a time delay between the edges of CLKin and CLKout signals until both clock signals are substantially synchronized. The skew between CLKin and CLKout signals is determined by the minimum resolution of the delay cell. When the clock signals are synchronized, the DLL is locked and DS signal is locked to DQ signal.

Figure 3A:
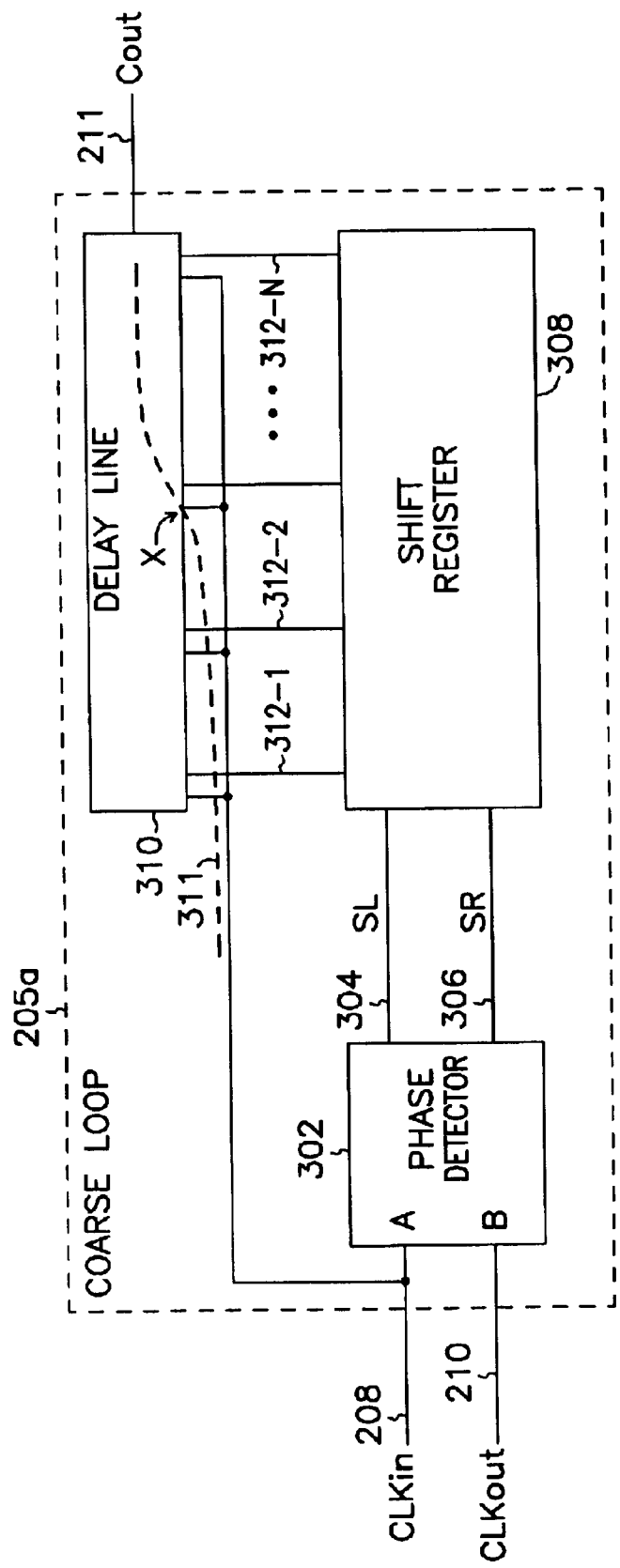
FIG. 3A is a block diagram illustrating a block diagram of a coarse loop of a delay locked loop (DLL) of the invention.

FIG. 3A illustrates a block diagram coarse loop 205a of DLL 111 of FIG. 2A. Coarse loop 205a of DLL 111 includes a phase detector 302 having an input A connected to input node 208 for receiving CLKin signal and an input B connected to input node 210 for receiving the CLKout signal. Phase detector 302 also includes outputs 304 and 306 for providing a shift left (SL) and a shift right (SR) signals to a shift register 308. Shift register 308 provides control and selects the amount of delay of a delay line 310 through a plurality of control lines 312 1–N. Delay line 310 receives CLKin signal at an input node 208 and provides a delayed output signal or coarse loop output signal Cout at output node 211.

When a control line 312 1–N is selected, an entry point into delay line 310 is created at point X (FIG. 3A). CLKin signal enters the delay line at point X and propagate through the delay line to output node 211. A path of CLKin from entry point X to output 211 is indicated as path 311. When point X is at the left most of the delay line, the most delay is applied to CLKin signal. In the opposite, when point X is at the right most of the delay line the least amount of delay applied to CLKin signal. The number of delay stages in the coarse loop determines the lock range of DLL 111. Detailed description of the operation of the DLL of FIG. 3A is best described in conjunction with timing diagrams illustrated in FIGS. 3B–C and FIGS. 4A–B.

Figure 3B:
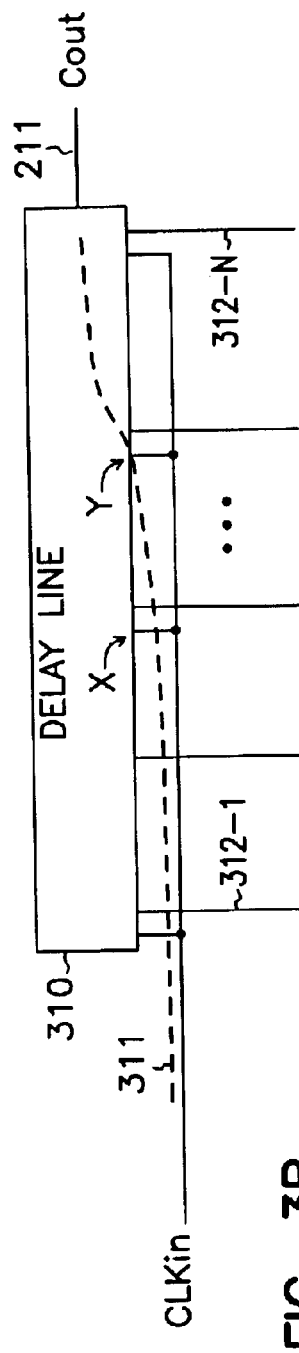
FIG. 3B shows one embodiment of a delay line for the DLL of FIG. 3A.
Figure 3C:
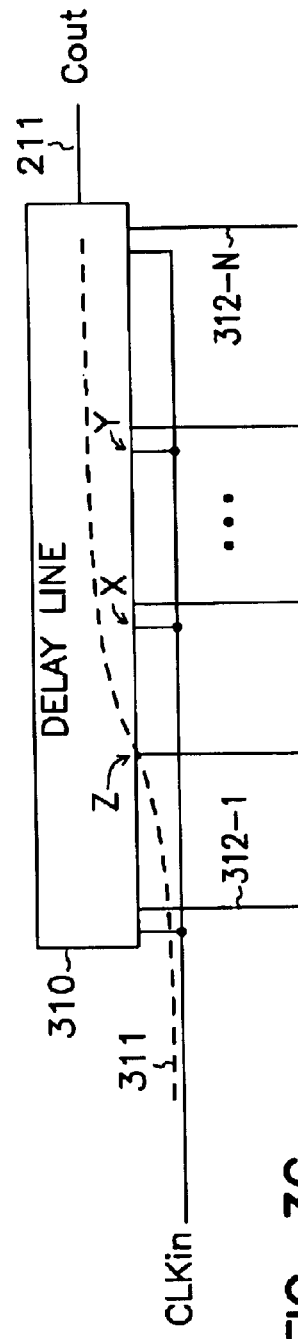
FIG. 3C shows another embodiment of a delay line for the DLL of FIG. 3A.

FIG. 3B shows delay 310 of DLL 111 when one of the control lines 312 1–N is selected. In the Figure, an entry at point Y is created resulting after a shift right from register 308. FIG. 3C shows another situation of delay line 310 in which an entry at point Z is created after a shift left from register 308.

FIGS. 4A–B shows a timing diagram with waveforms of CLKin and CLKout signals. FIG. 4A shows a timing diagram when CLKin signal is leading CLKout signal. In this case, in order for both signals to be synchronized the amount of delay applied to CLKin signal must be decreased. FIG. 4B shows a timing diagram when CLKin signal is lagging CLKout signal. In this situation, the delay amount to CLKin signal must be increased to synchronize CLKin and CLKout.

In the case when CLKin is leading CLKout, phase detector 302 compares a relative timing of the edges of CLKin and CLKout signals and produces a SR signal. Upon receiving the SR signal, shift register 308 selectively activates one of the control lines 312 1–N to select an entry point into delay line 310 to shift the point of entry to the right to decrease the delay amount. For example, assuming that before the shift, CLKin signal enters delay line 310 at point X. When shift register 308 receives the SR signal, it selects one of the control lines 312 1–N and creates a new point of entry at point Y, to the right of point X. Since point Y is closer to the right of the delay line than point X, the amount of delay to CLKin signal is decreased until CLKin and CLKout signals are synchronized, as shown in FIG. 4B.

In the case when CLKin is lagging CLKout, phase detector 302 produces SL signal. Subsequently, shift register 308 shift the point of entry to the left of point X at point Z. Since point Z is closer to the left of the delay line, the delay to CLKin is increased. Consequently, CLKin and CLKout signal are synchronized, as shown in FIG. 4D.

Figure 5A:
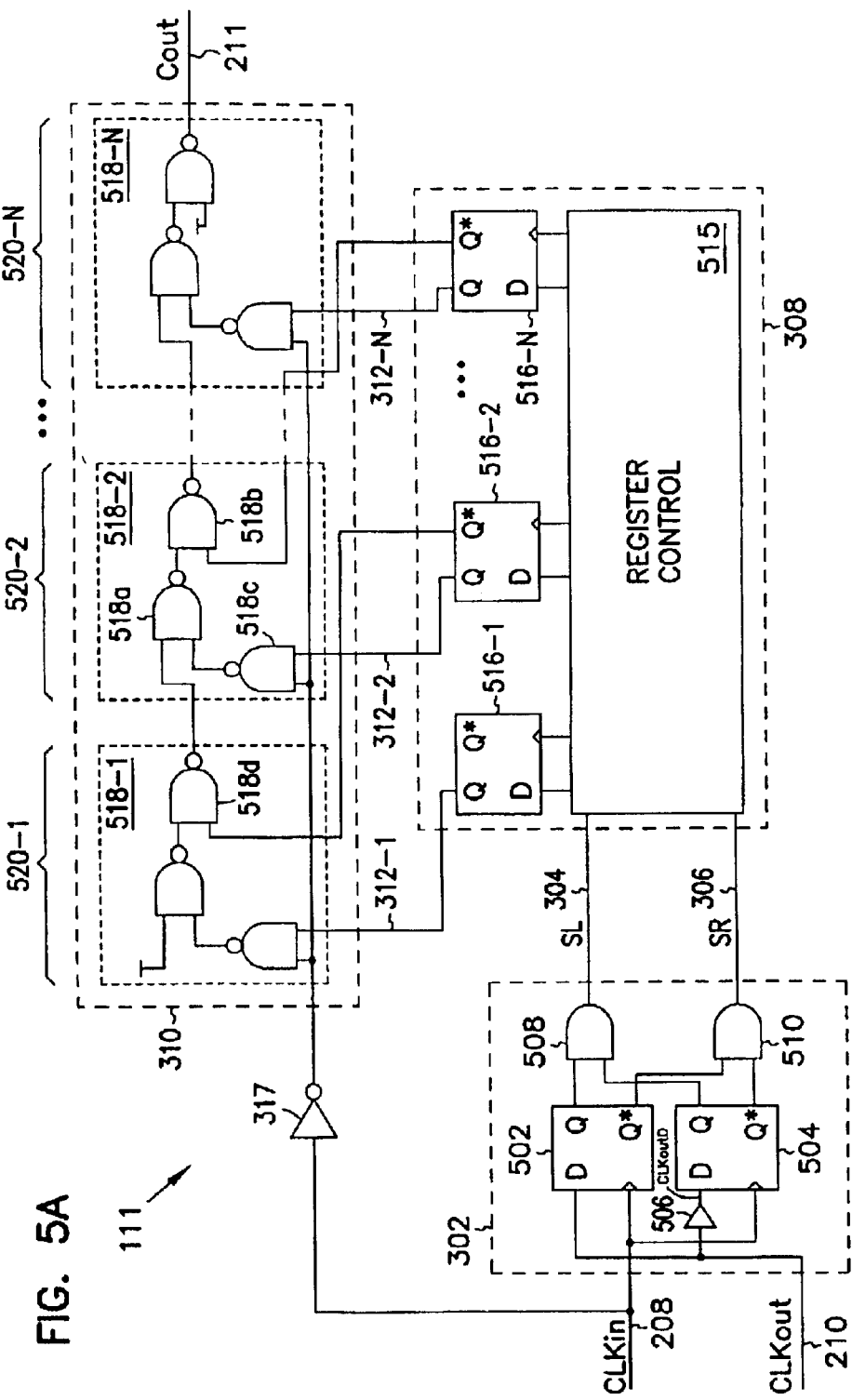
FIG. 5A illustrates a schematic diagram of the coarse loop of the DLL of FIG. 3A.

FIG. 5A illustrates a schematic diagram of DLL 111. In the Figure, phase detector 302 includes two flip flops (FF) 502 and 504. Each of the flip flops includes inputs D and CLK and complementary outputs Q and Q*. Input D of FF 502 receives CLKin signal and input D of FF 504 receives a delay version of CLKin signal through a delay 506. Both inputs CLK of the flip flops are connected to node 210 for receiving signal CLKout. Both outputs Q are connected to AND gate 508. Both outputs Q* are connected to AND gate 510. The outputs of AND gates 508 and 510 are connected to outputs 304 and 306 of phase detector 302, respectively. The outputs of AND gates 508 and 510 provide control signals to shift register 308. Shift register 308 includes a register control 515 which controls a plurality of register cells 516 1–N. Each of the register cells includes a D-type flip flop having output Q and a complementary output Q*. Delay line 310 includes a plurality of delay cells 518 1–N. Each of the delay cells includes a plurality of delay elements, such as NAND gates 518a, 518b and 518c of delay cell 518-2. Each of the delay cells receives an inversed version of CLKin at an output of an inverter 317. For example, NAND gate 518c is connected to the output of inverter 317 to receive the inversed version of CLKin signal. The other input of NAND gate 518c receives a control signal from output Q of the register cells 516 1–N.

The register cells are connected to the delay cells through control lines 312 1–N to form a plurality of sequential delay stages 520 1–N. For instance, register cell 516-2 is connected to delay cell 518-2 via control line 312-2 to form a delay stage 504-2. Furthermore, output Q* of each of the register cells is connected to a previous delay stage. For example, output Q* of register cell 516-2 of delay stage 520-2 is connected to an input of NAND gate 518d of delay stage 520-1. Q* is connected as such to ensure that when a particular delay state is selected by register cells 516 1–N, the previous delay stages are disabled. The contents of register cells in the previous stages will be ignored.

Each delay stage is capable of delaying a signal by about 200 ps (peco seconds). Thus it is a design choice to construct a total number of the delay stages to accommodate a range of operating frequency of the memory device. For example, a memory operating with a frequency of 100 MHz or a 10 ns (nano second) clock cycle, would have more delay stages than a memory operating at a 250 MHz (a 4 ns second clock cycle). With 100 MHz frequency, the minimum total number of delay stages required is 50 (10 ns divided by 200 ps), whereas with a 250 MHz frequency it would requires a minimum of 20 delay stages. Therefore the minimum operating frequency is the inverse of the product of the number of delay stages and the delay per stage. In the example above, a DRAM device having a delay line including 50 delay stages can be used in a frequency ranging from 100 MHz to 250 MHz assuming that the total delay is within one clock cycle.

Furthermore, the delay elements are constructed the same to ensure that a propagation from one delay element to the next delay element is the same. For example, delay element 518a and 518b are both NAND gates. This means that a propagation delay through the delay element (NAND gate) of a high-to-low transition is equal to a propagation delay of a low-to-high transition and output of this delay line has little duty cycle distortion. This characteristic enables DLL 111 of the invention to be used in a double data rate (DDR) DRAM device, where a read or write operation occurs on both rising edge and falling edge of the a clock signal. In addition, using two input delay elements such as the two input NAND gates of delay cell 518-2, provides flexible control from shift register 308 to delay line 310. That means each of the delay cells can have at least two control inputs. For example, inputs of NAND gates 518b and 518c can be controlled by Q and Q* of each of the register cells. Q is connected to create an entry point at NAND gate 518c while Q* is connected to disable previous stages once the entry point is created.

Figure 5B:
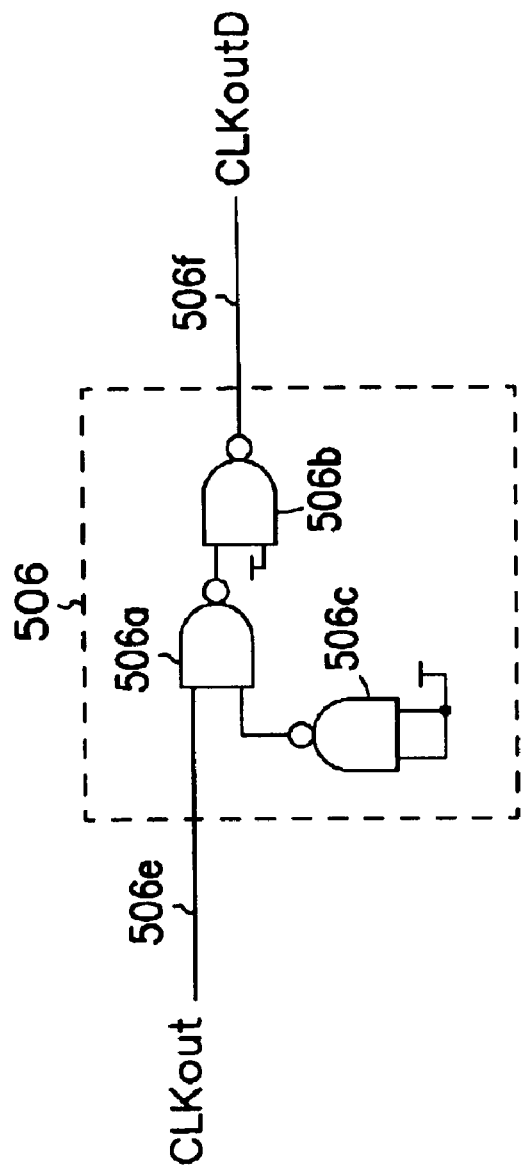
FIG. 5B illustrates a schematic diagram of a delay of FIG. 5A.

FIG. 5B illustrates one embodiment of delay 506 of phase detector 302 of FIG. 5A. Delay 506 has similar construction to one of the delay cells 520 1–N of delay line 310. In the Figure, delay 506 includes NAND gates 506a–c arranged in the same way as NAND gates 508a–c of delay cell 518-2. Delay 506 has an input at node 506e of NAND gate 506a for receiving in signal CLKout from node 210 and an output at node 506f for providing the CLKoutD signal. As shown in the Figure, the delay between CLKout and CLKout signal is equal to, or configured to be one of the delay cells 518 1–N of delay stages 520 1–N. This configuration is helpful to track the delay variation in the delay line and provide stable operations.

Figure 6A:
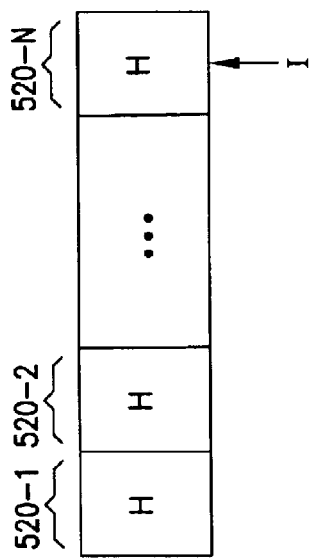
FIG. 6A is a block diagram of delay stages of the DLL of FIG. 5A.
Figure 6B:
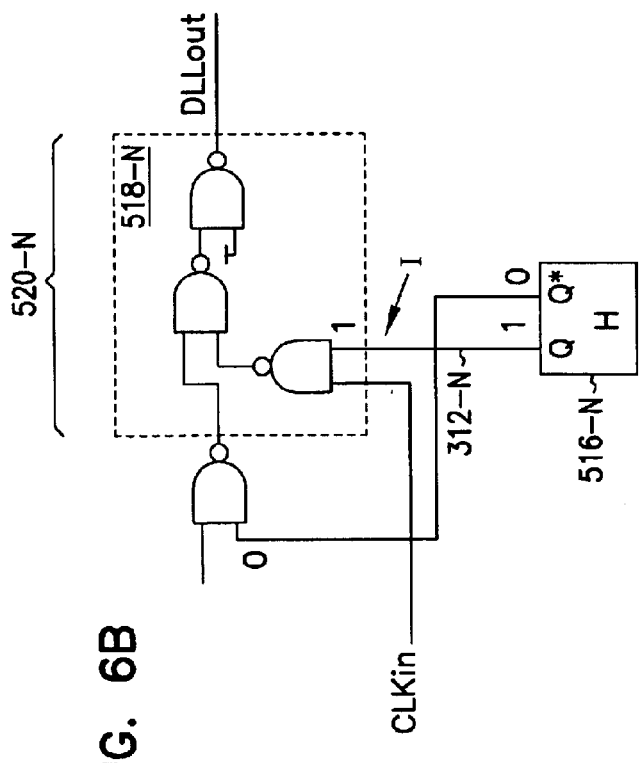
FIG. 6B shows in more details a schematic diagram of a delay stage of the DLL of FIG. 6A.

The DLL of FIG. 5A is best understood with reference to FIGS. 6A–7D. FIGS. 6A–B show an exemplary initial conditions of delay stage 520-N. In FIGS. 6A–B, all delay cells have a logic HIGH and the point of entry, point I, is the point closest to the right of the delay line at the last delay stage 520-N. FIGS. 7A–B show timing diagrams of exemplary initial conditions of waveforms of signals CLKin and CLKout. FIG. 7A shows a timing diagram when CLKin is leading CLKout by an amount of time indicated by Td. FIG. 7B shows a timing diagram when CLKin and CLKout signals are synchronized.

Figure 7A:
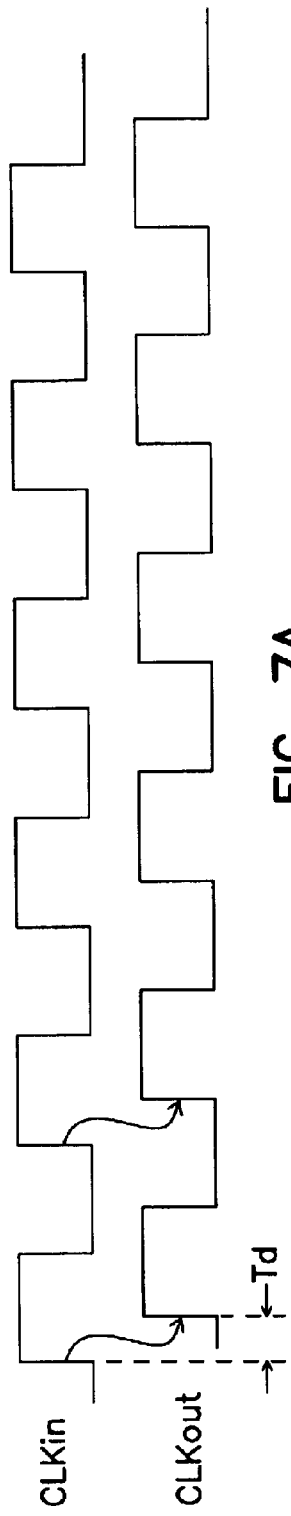
FIGS. 7A–D illustrate timing diagrams of FIG. 5A.
Figure 7B:
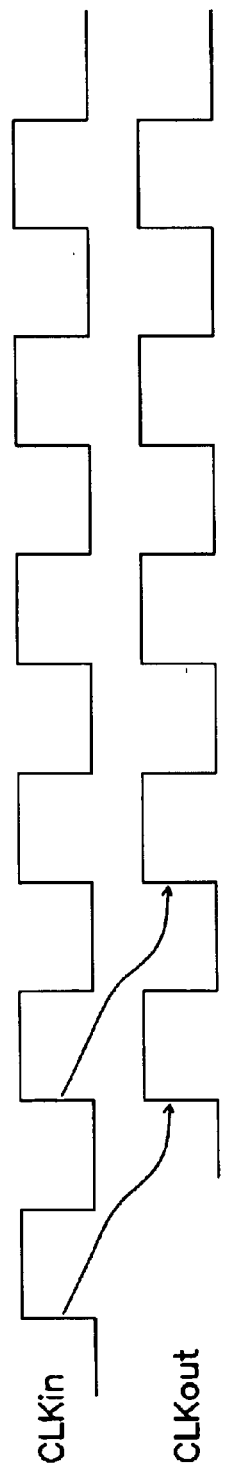

In general, assuming that the frequency of CLKin is 200 MHz and an internal delay of memory device 100 is 2 ns, or CLKin is leading CLKout by 2 nano seconds (2 ns). In this case, more delay needs to be added to CLKin. Specifically, 3 ns is needed to add to CLKin to make the total delay equal to one clock cycle or 5 ns. After the delay is added both signals are synchronized as shown in FIG. 7B. When phase detector (FIG. 5) detects the time difference Td, it activates SL signal. Upon receiving the SL signal, register control 515 activate one of the control line 312 1–N to create an entry point into delay line 310. Since each of the delay stages 520 1–N has a 200 ps delay (0.2 ns), therefore 15 delay stages are needed to have a total of 3 ns delay. In this case, shift register 308 shifts the point of entry 15 position from the left of the current position. From both exemplary situations described in FIGS. 7A–7B, a total delay equals one clock cycle or the sum of the amount applied by the delay line plus the internal delay.

Figure 7C:
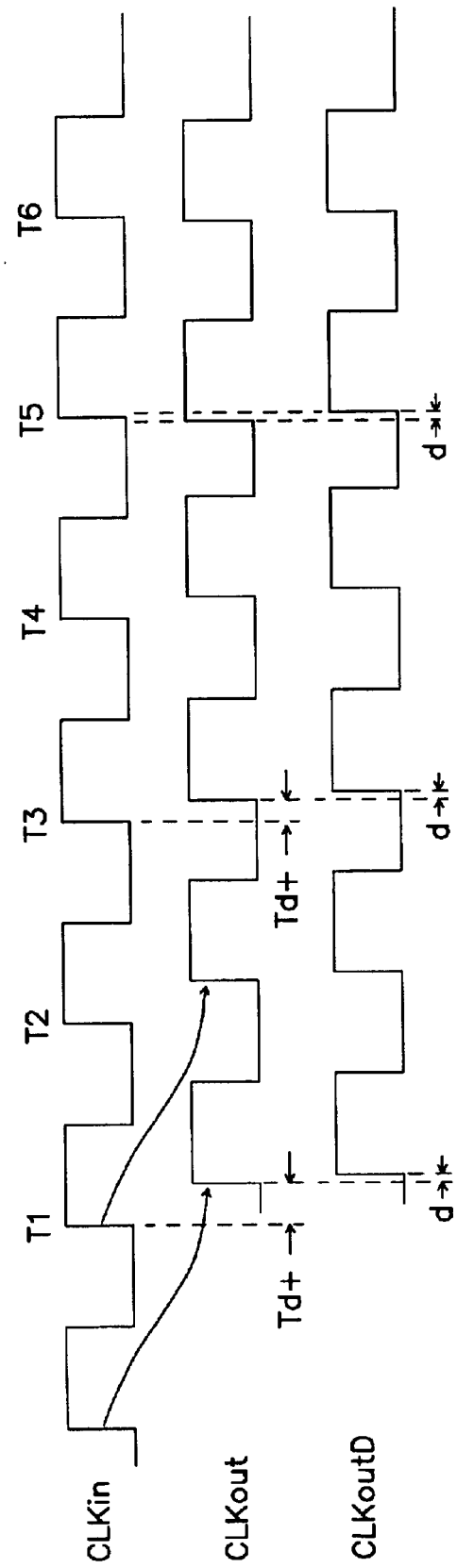

FIG. 7C shows a timing diagram of another exemplary situation of DLL of FIG. 5. The Figure shows waveforms of CLKin, CLKout and a delay version of CLKout signal indicated as CLKoutD which is the input signal at input D of flip flop 504. In the Figure, at time T1, CLKin is leading CLKout by a time indicated by Td+. AT time T1, CLKin transitions from Low to HIGH, input D of both FF 502 and 504 are LOW and both output Q* are HIGH. This makes output of AND gate 510 HIGH which sends SR signal to register control 515. Shift register 308 makes a shift right at time T2 to decrease the amount of delay. At this time, one of the control lines 312 1–N is selected and a new point of entry into delay line 310 is chosen. The new point of entry is positioned to the right of the current point of entry. The new point of entry enables the delay line to decrease the amount of delay, thus Td+ is smaller at time T3. At time T4, phase detector 302 makes another decision and shift register further make another shift right because CLKin is still leading CLKout. At time T5 when the rising edge of CLKin is within (in between) the rising edges of CLKout and CLKoutD, that is CLKin transitions from LOW to HIGH after CLKout transition HIGH and before CLKoutD transition high. This makes both outputs of AND gates 508 and 510 are LOW, at this point the DLL is locked.

Figure 7D:
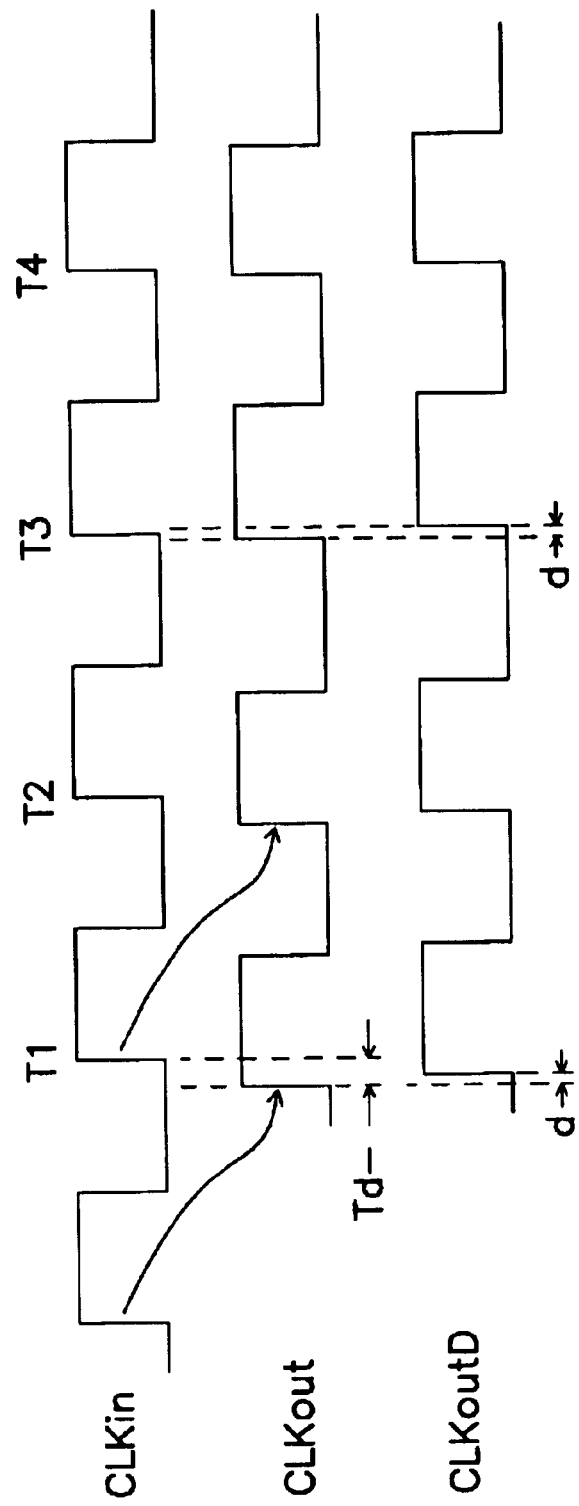

FIG. 7D shows timing diagram of another exemplary situation of DLL of FIG. 5. The Figure shows a waveforms of CLKin, CLKout and CLKoutD where CLKin is lagging CLKout by a time indicated by Td–. DLL 111 in this case performs a shift left instead of a shift right as in the case of FIG. 7C. In FIG. 7D. At time T1, CLKin transition HIGH, CLKout and CLKoutD are both HIGH thus both outputs Q of flip flop 502 and 504 are HIGH. This makes the output of AND gate 508 HIGH and an SL signal is sent to shift register 308 which enables the shift register to make a shift left to increase the amount of delay. At time T2 shift register 308 move the current point of entry to the left to apply appropriate amount of delay to CLKin signal. AT time T3 when the rising edge of CLKin is within the rising edges of CLKout and CLKoutD, that is when CLKin transitions from LOW to HIGH after CLKout transition HIGH and before CLKoutD transition high. Thus both outputs of AND gates 508 and 510 are LOW which locks the DLL.

Figure 8:
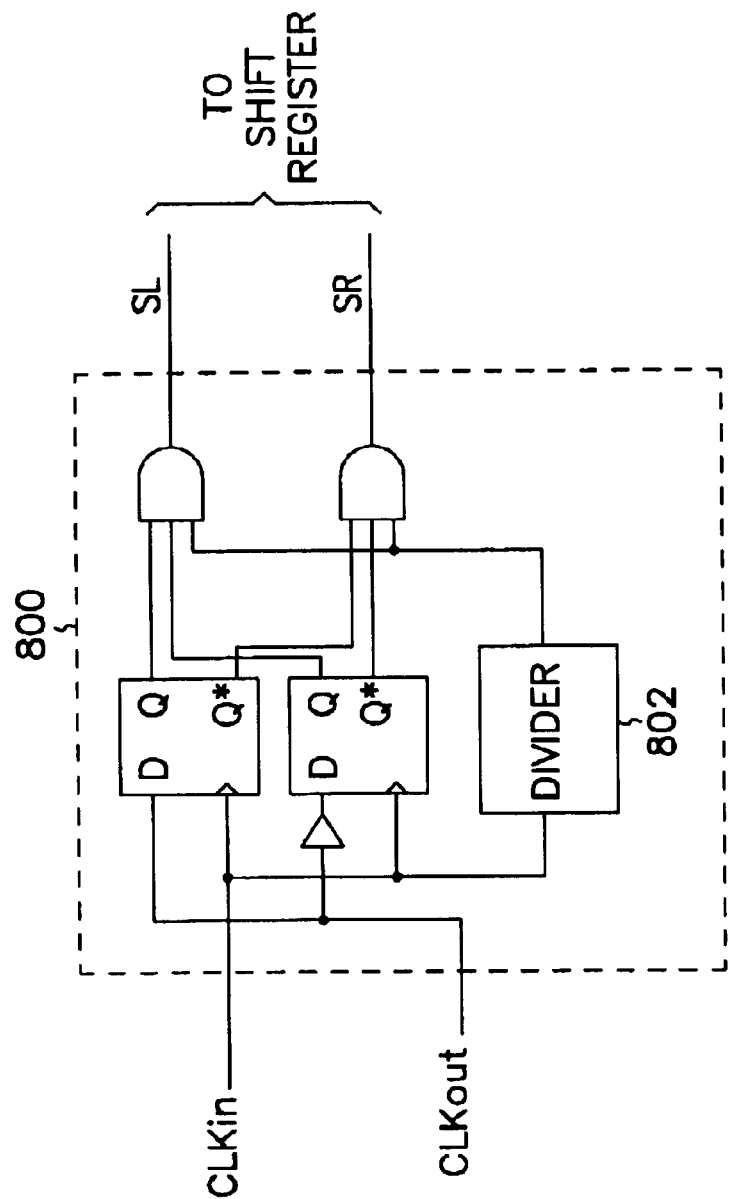
FIG. 8 shows another embodiment of a phase detector for the DLL of FIG. 5A.

FIG. 8 shows another embodiment of a phase detector of coarse loop 205a of the invention. In the Figure, phase detector 800 is constructed similar to phase detector 302 of DLL 111 of FIG. 5A with the exception of a divider 802. Divider is used to provide enough time for the shift register to settle down and the flip flops (502 and 504) of the phase detector to solve the metastability problems. Those skilled in the art will readily recognize that the number of divider 802 can be calculated to meet timing specification or operating frequency of the DRAM device.

Figure 9:
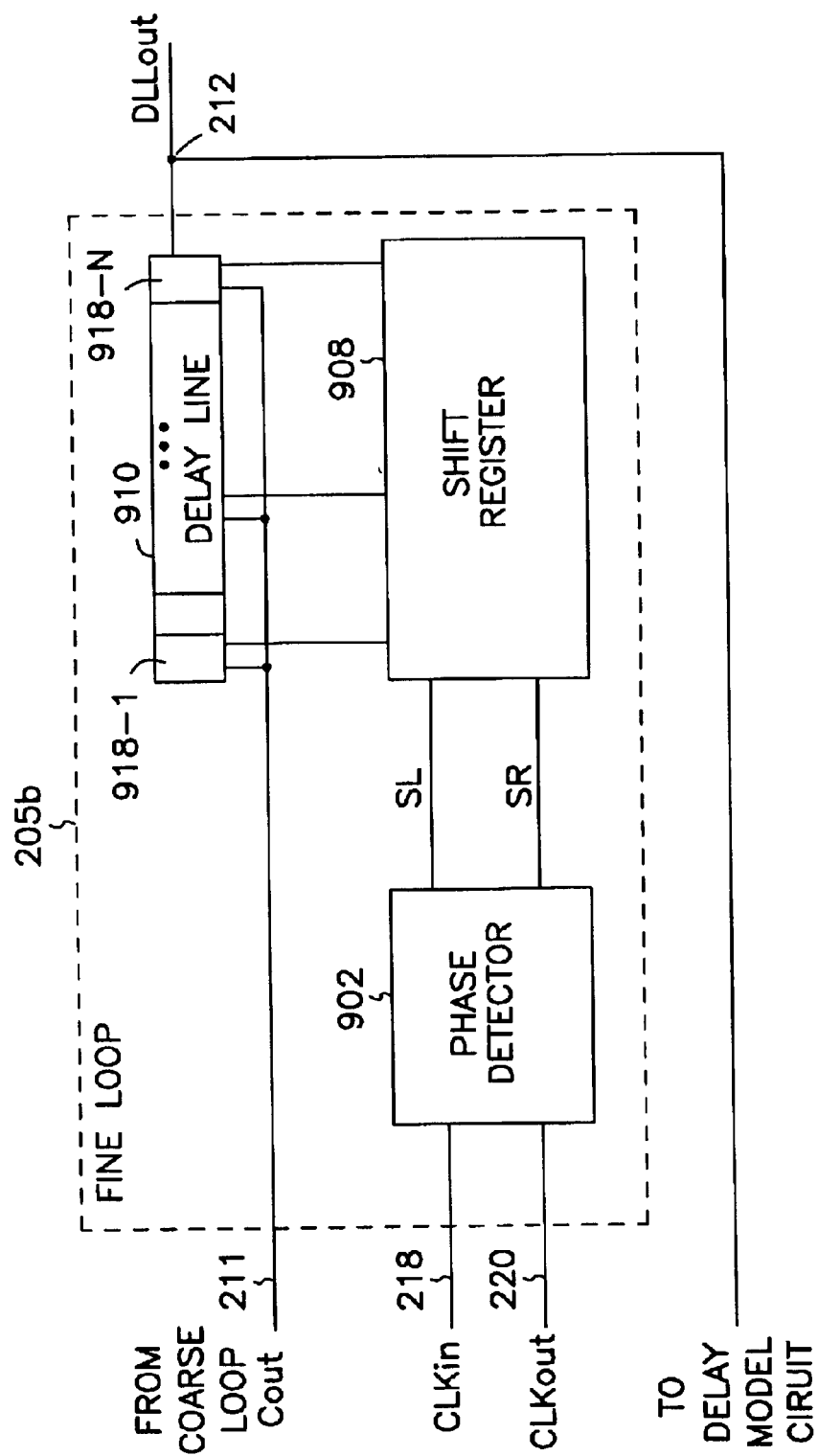
FIG. 9 illustrates one embodiment of a digital dual-loop DLL of the invention.

FIG. 9 shows a block diagram of fine loop 205b of DLL 111 FIG. 3A. Fine loop 205b is constructed and operates substantially the same as coarse loop 205a. In general, fine loop 205b can comprise a delay line having a plurality of delay stages. Each of the delay stages includes a vernier delay (for example, 20 ps), which is substantially smaller than a delay of each of the delay stages of the coarse loop (for example, 200 ps). Fine loop 205b has a smaller delay range, for example a minimum delay of about 1ns and a maximum delay of about 1.2 or a total range of 200 ps. Thus fine loop can include 10 delay stages. In FIG. 9, fine loop 205b includes a delay line 910 connected to receive output signal Cout from coarse loop 205a at node 211. Delay line 910 is controlled by a shift register 908 which receives control signals, or shifting signals, SR and SL from a phase detector 902. Phase detector 902 receives CLKin signal at node 218 and CLKout signal at node 220. Delay line 910 includes a plurality of delay cells 918 1–N. One embodiment of a delay cell of delay line 910 is shown in FIG. 10.

Figure 10:
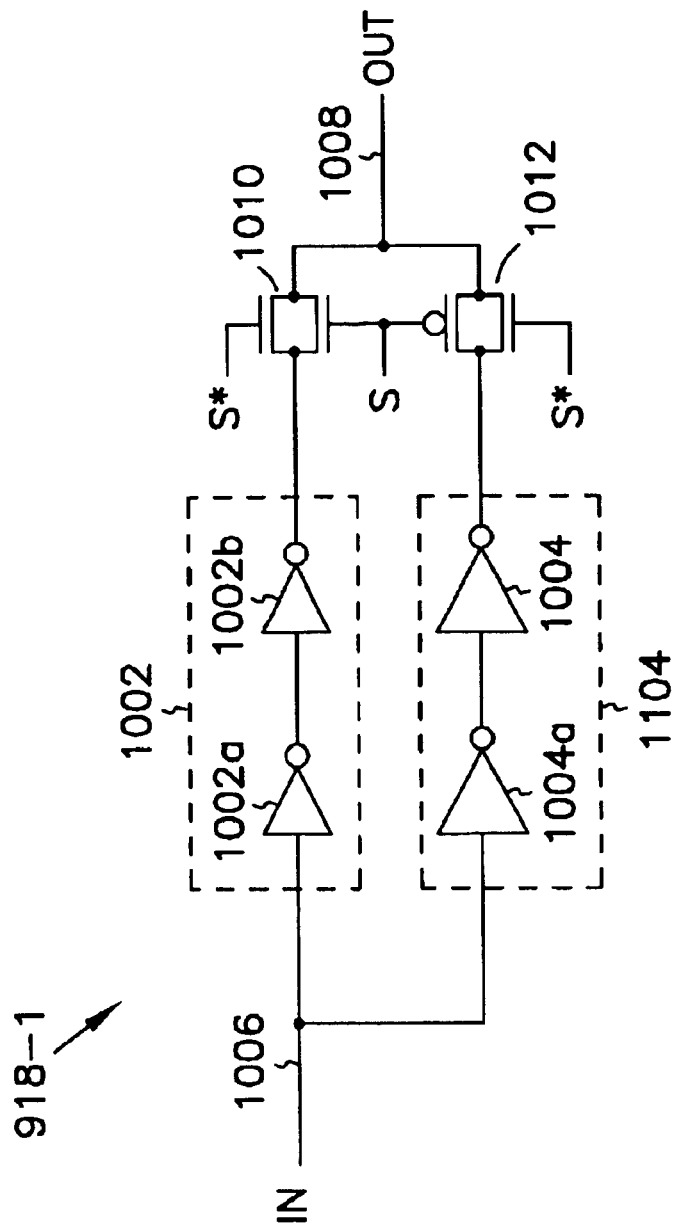
FIG. 10 illustrates a block diagram of a fine loop of the dual-loop DLL of FIG. 9.

FIG. 10 shows one embodiment of a delay cell of delay line 910 of fine loop 205b of FIG. 9. Delay cell 918-1 includes a plurality of inverters. Inverters 1002a and 1002b form a first path 1002 and inverters 1004a and 1004b form a second path 1004. The paths are connected to receive an input signal (IN) at node 1006. For example, path 1002 has a delay of 100 ps and path 1004 has a delay of 120 ps. The inverters of path 1004 can be constructed with longer L (channel length of a transistor in the inverter) than the inverters of path 1002 to have a longer delay. This vernier delay can be adjusted according to the resolution of the fine loop. Paths 1002 and 1004 are connected to switches 1010 and 1012 which are control by complementary control signals S and S* which selectively control the passage of the input signal from node 1006 to an output at node 1008. In one embodiment, control signals S and S* are connected the output Q and Q* of the register cell.

Figure 11:
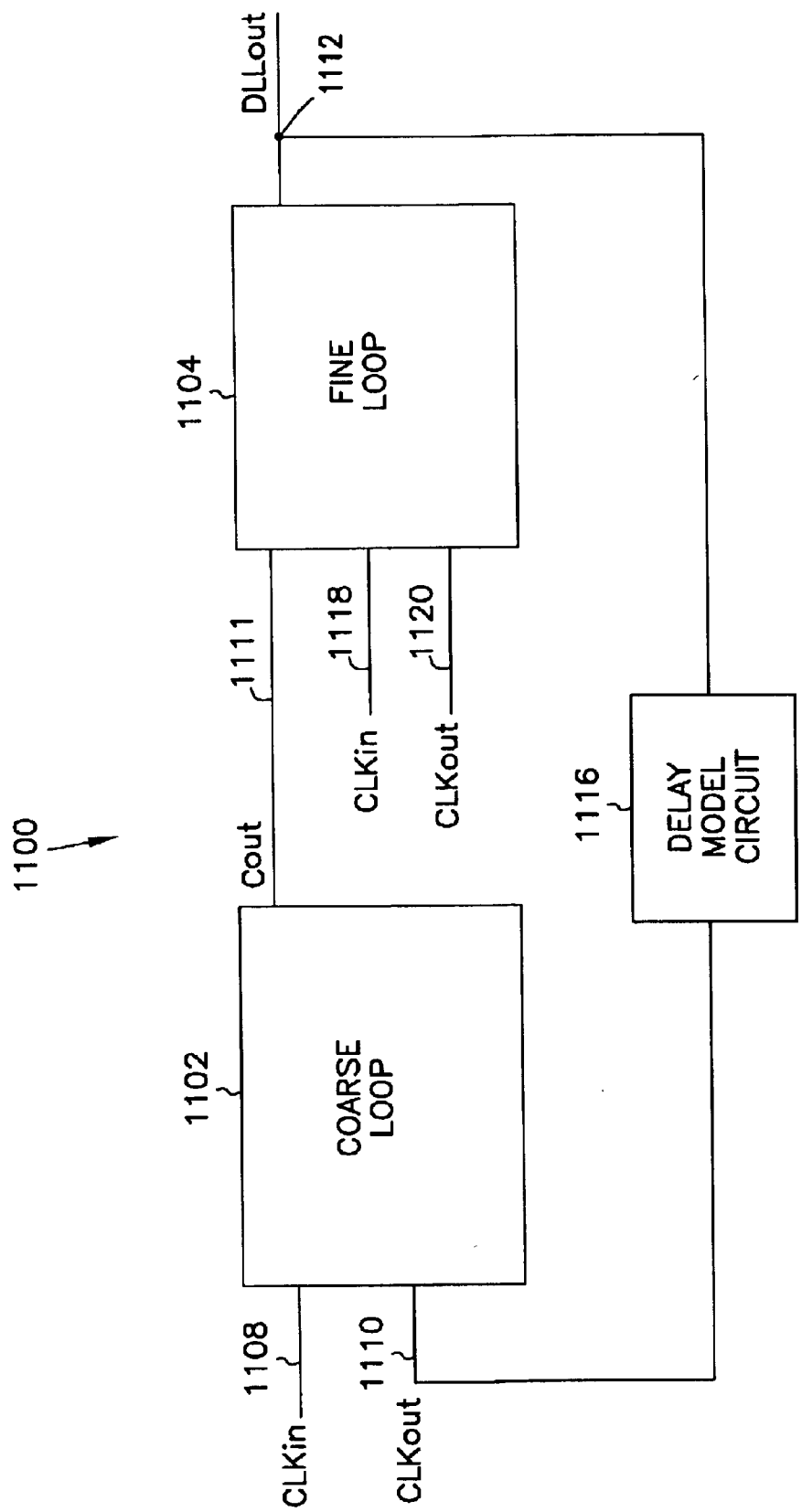
FIG. 11 shows one embodiment of a delay cell of the delay line of FIG. 10.

FIG. 11 shows one embodiment of a dual-loop DLL 1100 according to the invention. DLL 1100 having a coarse loop 1102 connected to a fine loop 1104. Coarse loop 1102 receive input signals CLKin at node 1108 and CLKout at node 1110. Coarse loop 1102 produces a first delayed output signal or coarse loop output signal Cout at node 1111. Fine loop 1104 receives Cout signal at node 1111, CLKin signal at node 1118 and CLKout signal at node 1120. Fine loop 1104 produces a second output signal DLLout at node 1112. A delay model circuit 1116 is included to the DLL and is connected at node 1112 to receive the DLLout signal and provide the CLKout signal at node 1110. Coarse loop 1102 and fine loop 1104 are constructed and operates the same as coarse loop 205a and 205b of DLL 111 of FIG. 5, respectively.

In operation, since it is a dual-loop DLL, DLL 1100 provides a wide lock range and tight locking by the dual loops represented by coarse loop 1102 and fine loop 1104. DLL 1100 operates in the same manner as DLL 111. Fine loop 1104 further reduces the skew between the edges of CLKin and CLKout of coarse loop 1102. That is when coarse loop 1102 is locked, the edges of CLKin and CLKout have about 200 ps peak-to-peak jitter because the coarse loop has two NAND gates or 200 ps delay in each of the delay cells. This jitter from the coarse loop, in some cases, may not be preferable for a high speed DRAM device. The fine loop interpolates the delay and the jitter is even smaller, about 20 ps peak-to-peak (10 times smaller) and provides overall a tight locking.

Figure 12:
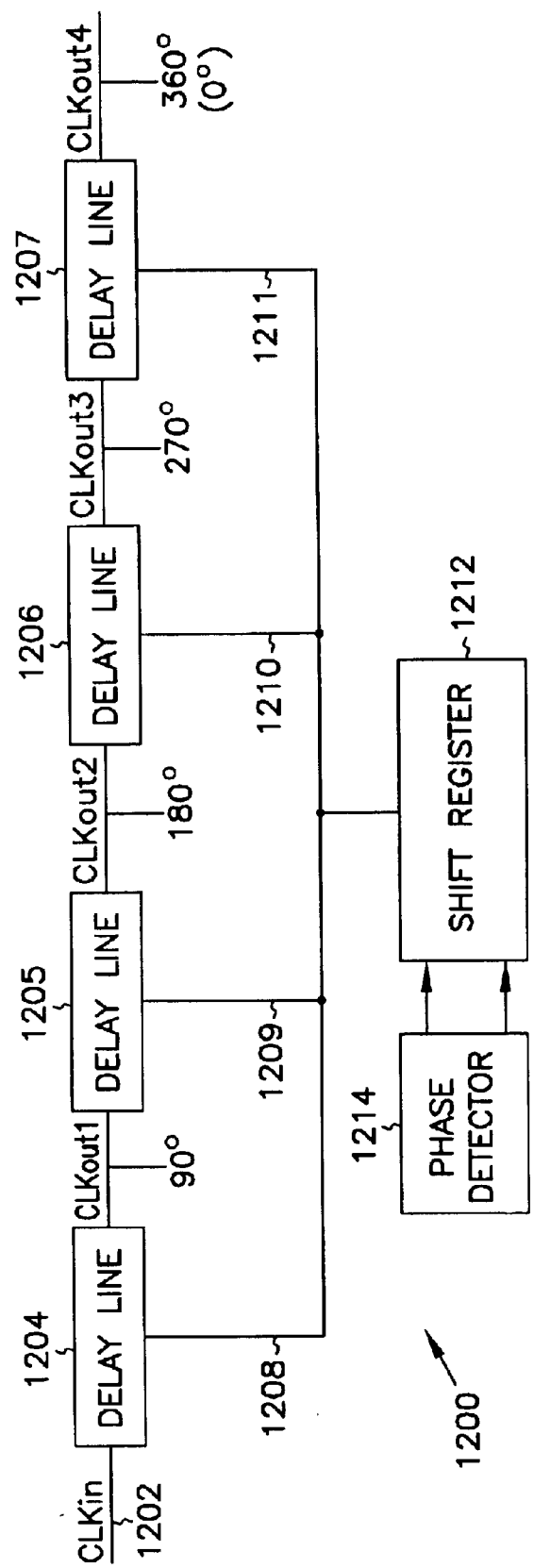
FIG. 12 is a block diagram showing an embodiment of a multi-phase generator including the novel DLL of FIG. 9.

FIG. 12 shows an embodiment of a multi-phase generator including the novel DLL of the invention. Multi-phase generator 1200 including a plurality of delay lines 1204-7, each of the delay lines have the same delay time. The delay lines receives an input clock signal CLKin at note 1202 and produce a plurality of output signal CLKout1–4 at the outputs of the delay lines. When each of the delay lines is locked and four delay lines are used, the output signal at the output of each of the delay lines is a multiple of 90 degrees out of phase with the input signal CLKin. That means the output signal of delay line 1204-7 is 90, 180, 270 or 360 degrees out of phase with CLKin signal, respectively. A shift register 1212 is connected to receive control signals from a phase detector 1214 to control the delay lines.

Figure 13:
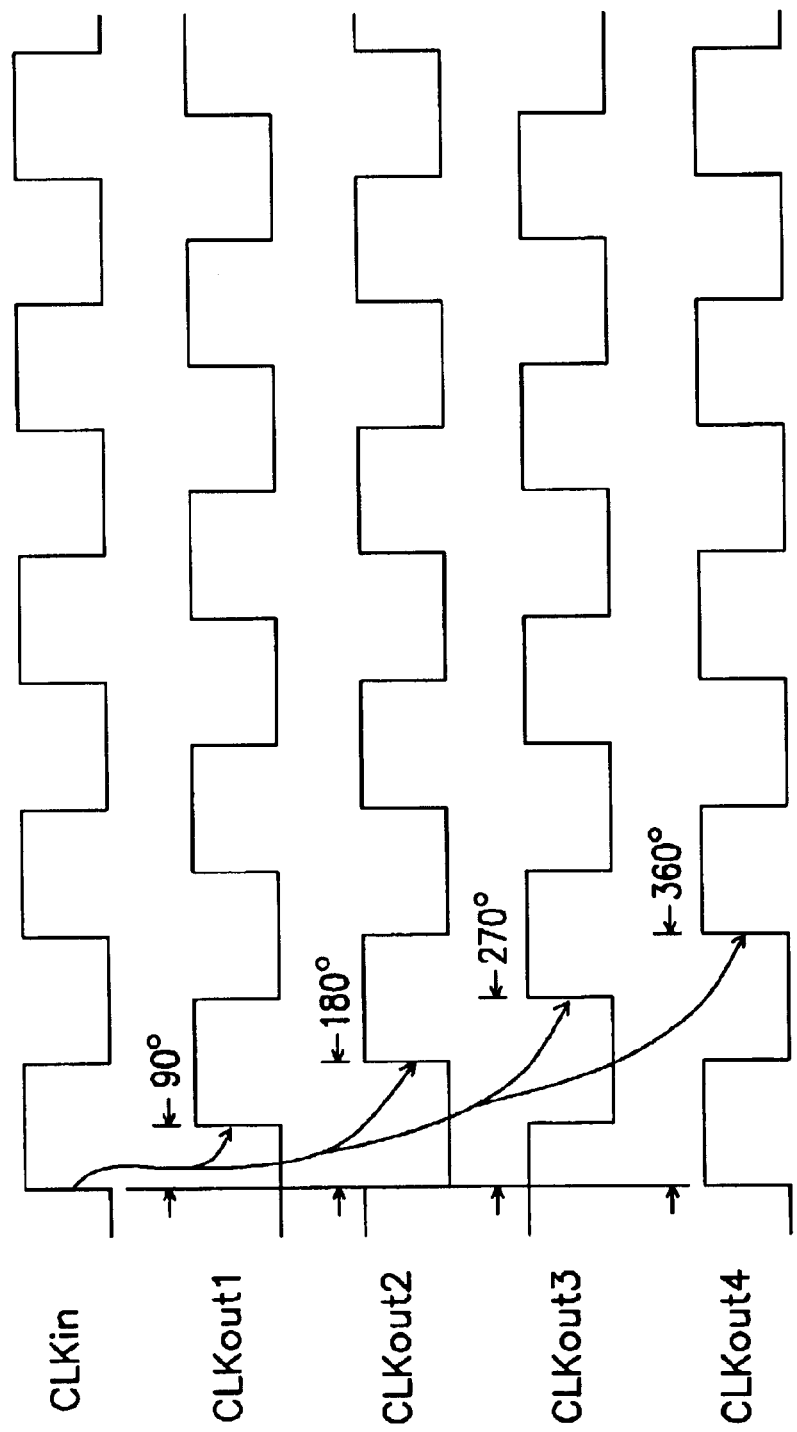
FIG. 13 is a timing diagram showing waveforms of the DLL of FIG. 12.

FIG. 13 is a timing diagram showing signal relationship of the input signal CLKin and the output signals CLKout1–4. The operation of multi-phase generator 1200 is similar to the operation of DLL 111 described above. Control register 1202 simultaneously applies a shift to delay lines 1204-7. When the multi-phase generator is locked, assuming the delay is equal to one clock period, it has four different clock signals having four different phases at its outputs. As shown in FIG. 13, when multi-phase generator 1200 is locked, output signal CLKout1 is 90 degrees out of phase with the input signal CLKin. Output signal CLKout2 is 180 degrees out of phase with the input signal CLKin. Output signal CLKout3 is 270 degrees out of phase with the input signal CLKin. And output signal CLKout4 is 360 degrees out of phase with the input signal CLKin. Those skilled in the art will readily recognize that other number of delay lines of multi-phase generator 1200 can be used to generate other output signals with different phases. For example, to generate six different phases with each having a 60 degrees out of phase, six delay lines are needed.

Figure 14:
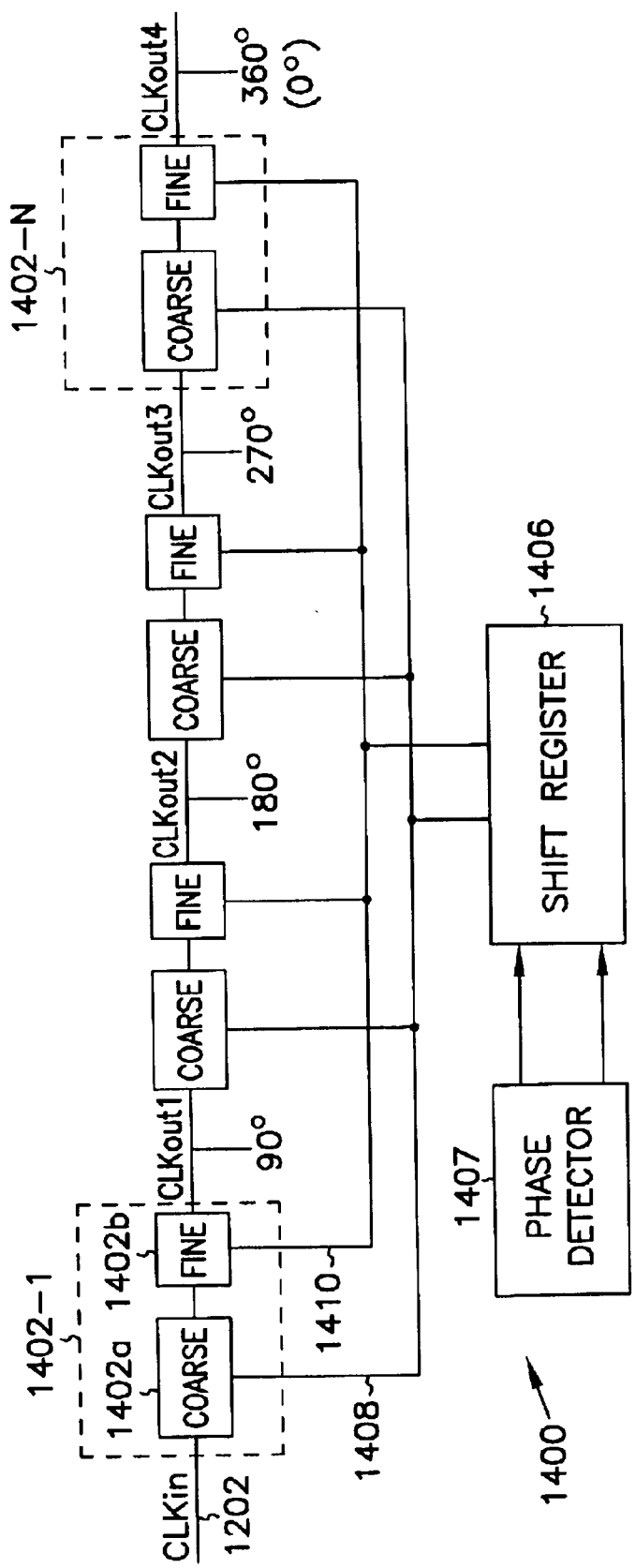
FIG. 14 is a block diagram showing another embodiment of a multi-phase generator having a DLL configuration of FIG. 9.

FIG. 14 shows another embodiment of a multi-phase generator including the novel dual-loop DLL of the invention. Multi-phase generator 1400 is similar to multi-phase generator 1200 of FIG. 12 with the exception of an addition of a plurality of fine loops. In the Figure, multi-phase generator 1400 includes a series connected delays 1402 1–N, each of the delay includes a coarse loop 1402a and fine loop 1402b. The coarse loop has a time delay substantially greater than a time delay of the fine loop. The coarse loop and fine loop of multi-phase generator 1400 is constructed the same as the coarse loop and fine loop of DLL 111 of FIG. 1. In this embodiment, the output signals are produced at the output of each of the fine loop. When each of the dual-loop DLL is locked and four DLL are used, the output signal at the output of each of the fine loop is a multiple of 90 degrees out of phase with the input signal CLKin. That means the output signal of fine loop 1402 1–N is 90, 180, 270 or 360 degrees out of phase with CLKin signal. A control register 1406 is connected to receives control signals from a phase detector 1407. Control register 1406 controls the shifting within the coarse and the fine loops through a plurality of control lines 1408 and 1410. Multi-phase generator 1400 functions in a similar manner as the multi-phase generator of FIG. 12. That is every clock cycle, 4 shifts are performed to generate 4 different phases at the output of each of the fine loops.

Figure 15:
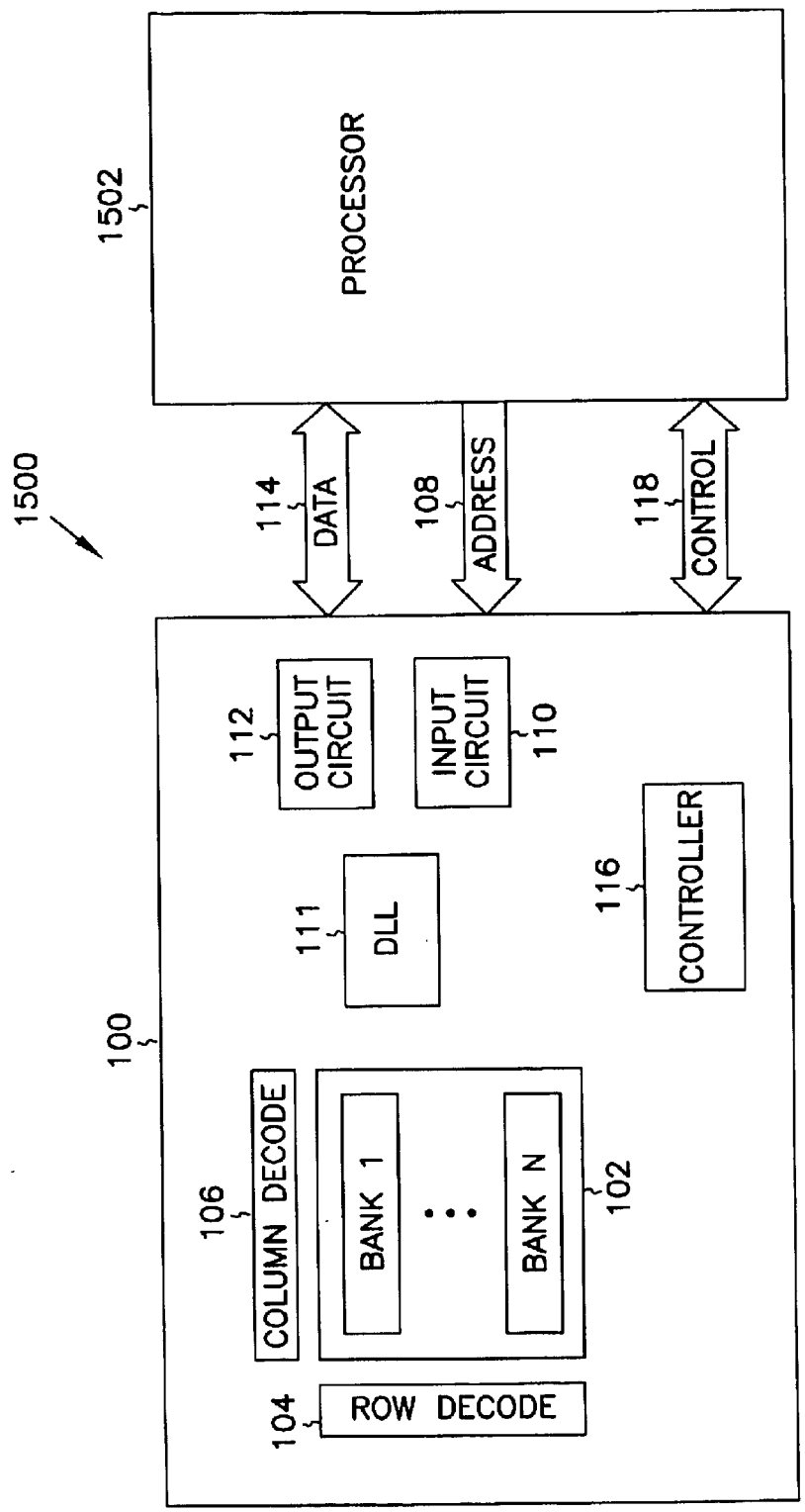
FIG. 15 illustrates a system including the memory device embodiment of FIG. 1.

FIG. 15 illustrates a system including the memory device having a DLL of the invention. System 1500 includes a processor 1502 connected to memory device 100 via the address bus 108, data bus 114 and control signals 118 which include, but are not limited to, a Chip Select (CS*), Row Access Strobe (RAS*), Column Access Strobe (CAS*), Write Enable (WE*), Clock Enable (CKE). During a memory access, such as a read or a write operation, processor 1502 provides an address on address bus 108. A combination of the control signals provided on control lines 118 indicates whether a read or a write operation needs to be performed. In case of a read operation, memory device 100 accesses main memory 102 using row decode 104 and column decode 106, and provides data read from main memory 102 to output circuit 112 and consequently to data bus 114. In case of a write operation, memory device 100 receives external data provided on data bus 114 at input circuit 110. The data is then written into main memory 102 at a location indicated by an address provided on address bus 108.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A circuit comprising:
   a first delay line for applying a first delay to an input signal to produce a first delayed signal;
   a first phase detector connected to the first delay line for comparing the input signal and a feedback signal to produce first shifting signals;
   a first shift register connected to the first phase detector for adjusting the first delay based on the first shifting signals, the first shift register including a number of register cells, each connecting to multiple delay cells of the first delay line;
   a second delay line connected to the first delay line for applying a second delay to the first delayed signal to produce a second delayed signal;
   a second phase detector connected to the second delay line for comparing the input signal and the feedback signal to produce second shifting signals; and
   a second shift register connected to the second phase detector for adjusting the second delay based on the second shifting signals.

2. The circuit of claim 1 further comprising a delay model connected to the second delay line for delaying the second delayed signal to produce the feedback signal.

3. The circuit of claim 1, wherein the first delay line includes a plurality of delay cells, each having identical delay elements.

4. The circuit of claim 3, wherein the second delay line includes a plurality of delay cells, each having a time delay smaller than a time delay of each of the delay cells of the first delay line.

5. The circuit of claim 3, wherein the first shift register includes a plurality of register cells, each connecting to multiple delay cells of the first delay line.

6. A circuit comprising:
a coarse loop including:
  a first delay line including a plurality of delay cells of a first delay range for applying a first delay to an input signal to produce a first signal delayed from the input signal by a first time delay;
  a first phase detector connected to the first delay line for comparing the input signal and a feedback signal to produce first shifting signals; and
  a first shift register including a plurality of register cells, each connecting to multiple delay cells for adjusting the first delay based on the first shifting signals; and
a fine loop including second delay range smaller than the first delay range, the fine loop connecting to the coarse loop for receiving the first signal to produce a second signal delayed from the input signal by a second time delay smaller than the first time delay.

7. The circuit of claim 6, wherein the fine loop includes:
a second delay line connected to the first delay line for applying a second delay to the first signal;
a second phase detector connected to the second delay line for comparing the input signal and the feedback signal to produce second shifting signals; and
a second shift register connected to the second phase detector for adjusting the second delay based on the second shifting signals.

8. The circuit of claim 6, wherein the delay cells include a plurality of identical delay elements.

9. The circuit of claim 6, wherein each of the delay cells includes only NAND gates.

10. The circuit of claim 6 further comprising a delay model connected to the second delay line for delaying the second signal to produce the feedback signal.

11. A circuit comprising:
a forward path including a coarse loop for delaying an input signal to produce a first signal having a first time delay from the input signal, and a fine loop connected to the coarse loop for delaying the first signal to produce a second signal having a second time delay from the input signal, the second time delay being smaller than the first time delay; and
a feedback path connected to the forward path for delaying the second signal to produce a feedback signal, the coarse loop including:
  a coarse delay line including a plurality of delay cells for applying a coarse delay to the input signal to produce the first signal;
  a coarse phase detector connected to the coarse delay line for comparing the input and feedback signals to produce coarse shifting signals; and
  a coarse shift register including a plurality of register cells, each connecting to multiple delay cells for adjusting the coarse delay based on the coarse shifting signals.

12. The circuit of claim 11, wherein the fine loop includes:
a fine delay line connected to the coarse delay line for applying a fine delay smaller than the coarse delay to the first signal to produce the second signal;
a fine phase detector connected to the fine delay line for comparing the input and feedback signals to produce fine shifting signals; and
a fine shift register connected to the fine phase detector for adjusting the fine delay based on the fine shifting signals.

13. The circuit of claim 12, wherein the fine delay line includes a plurality of delay cells, each having a time delay smaller than a time delay of each of the delay cells of the coarse delay line.

14. The circuit of claim 11, wherein each of the delay cells of the coarse delay line includes identical delay elements.

15. The circuit of claim 14, wherein the identical delay elements are NAND gates.

16. A phase generator comprising;
an input node to receive an input signal;
a plurality of delay lines connected in series, each of the delay lines including a plurality of delay cells, each of the delay cells including identical delay elements, each of the delay lines including an output to produce an output signal, wherein one of the delay line is connected to the input node to receive the input signal; and
a shift register including a plurality of register cells, each connecting to two delay cells to control the delay lines to make the output signal of each of the delay lines a multiple of N degrees out of phase with the input signal.

17. The phase generator of claim 16, wherein the identical delay elements are NAND gates.

18. The phase generator of claim 16, wherein the output signal of each of the delay lines is 90 degrees out of phase with the input signal.

19. The phase generator of claim 16 further comprising a phase detector connected to the shift register for providing control signals to the shift register.

20. A phase generator comprising:
an input node to receive an input signal;
a plurality of delay lines connected in series, each of the delay lines including a coarse loop connected to a fine loop, the coarse loop including a plurality of delay cells, each of the delay cells including identical delay elements, the fine loop of a previous delay line being connected to the coarse loop of the next delay line, and each of the delay lines including an output to produce an output signal, wherein one of the delay lines is connected to the input node to receive the input signal; and
a shift register including a plurality of register cells, each of the register cells being connected to two delay cells to control the delay lines to make the output of each of the delay lines a multiple of N degrees out of phase with the input signal.

21. The phase generator of claim 20, wherein the fine loop includes a plurality of delay cells, each having a time delay smaller than a time delay of each of the delay cells of the coarse loop.

22. The phase generator of claim 20, wherein the identical delay elements are NAND gates.

23. The phase generator of claim 20, wherein the output signal of each of the delay lines is 90 degrees out of phase with the input signal.

24. The phase generator of claim 20 further comprising a phase detector connected to the shift register for providing control signals to the shift register.

25. A memory device comprising:
a plurality of memory cells;
an output circuit connected to the memory cells; and
a delay circuit connected to the output circuit for controlling data transfer between the memory cells and the output circuit, the delay circuit including:
  a coarse loop including:
    a first delay line including a plurality of delay cells of a first delay range for applying a first delay to an input signal to produce a first signal delayed from the input signal by a first time delay;

a first phase detector connected to the first delay line for comparing the input signal and a feedback signal to produce first shifting signals; and a first shift register including a plurality of register cells, each connecting to multiple delay cells for adjusting the first delay based on the first shifting signals; and a fine loop including second delay range smaller than the first delay range, the fine loop connecting to the coarse loop for receiving the first signal to produce a second signal delayed from the input signal by a second time delay smaller than the first time delay.

26. The memory device of claim 25, wherein the fine loop includes:

a second delay line connected to the first delay line for applying a second delay to the first signal;

a second phase detector connected to the second delay line for comparing the input signal and the feedback signal to produce second shifting signals; and a second shift register connected to the second phase detector for adjusting the second delay based on the second shifting signals.

27. The memory device of claim 25, wherein the delay cells include a plurality of identical delay elements.

28. The memory device of claim 25, wherein each of the delay cells includes only NAND gates.

29. The memory device of claim 25 further comprising a delay model connected to the second delay line for delaying the second signal to produce the feedback signal.

30. A system comprising:

a processor; and a memory device connected to the processor, the memory device including:

a plurality of memory cells;

an output circuit connected to the memory cells;

a delay circuit connected to the output circuit for controlling data transfer between the memory cells and the output circuit, the delay circuit including:

a first delay line connected to the first delay line for applying a first delay to an input signal to produce a first delayed signal;

a first phase detector connected to the first delay line for comparing the input signal and a feedback signal to produce first shifting signals;

a first shift register connected to the first phase detector for adjusting the first delay based on the first shifting signals, the first shift register including a number of register cells, each connecting to multiple delay cells of the first delay line;

a second delay line connected to the first delay line for applying a second delay to the first delayed signal to produce a second delayed signal;

a second phase detector connected to the second delay line for comparing the input signal and the feedback signal to produce second shifting signals; and a second shift register connected to the second phase detector for adjusting the second delay based on the second shifting signals.

31. The system of claim 30 further comprising a delay model connected to the second delay line for delaying the second delayed signal to produce the feedback signal.

32. The system of claim 30, wherein the first delay line includes a plurality of delay cells, each having identical delay elements.

33. The system of claim 32, wherein the second delay line includes a plurality of delay cells, each having a time delay smaller than a time delay of each of the delay cells of the first delay line.

34. The system of claim 32, wherein the first shift register includes a plurality of register cells, each connecting to multiple delay cells of the first delay line.

35. A method comprising:

applying a first delay, using a delay line, to an input signal to produce a first delayed signal;

comparing the input signal and a feedback signal to produce first shifting signals;

adjusting the first delay based on the first shifting signals wherein adjusting the first delay is performed by a shift register, the shift register including a number of register cells, each connecting to multiple delay cells of the delay line;

applying a second delay to the first delayed signal to produce a second delayed signal;

comparing the input signal and the feedback signal to produce second shifting signals; and adjusting the second delay based on the second shifting signals.

36. The method of claim 35 further comprising:

delaying the second delayed signal to produce the feedback signal.

37. The method of claim 35, wherein the second delay is smaller than the first delay.

38. The method of claim 35, wherein adjusting the second delay is performed until the input and feedback signal are synchronized.

39. A method comprising:

applying a first delay, using a delay line, to an input signal using a coarse loop including a coarse range to produce a first signal delayed from the input signal by a first time delay;

comparing the input signal and a feedback signal to produce first shifting signals;

adjusting the first delay based on the first shifting signals wherein adjusting the first delay is performed by a shift register, the shift register including a number of register cells, each connecting to multiple delay cells of the delay line; and producing a second signal delayed using a fine loop including a fine delay range smaller than the coarse delay range to produce, the second signal being delayed from the input signal by a second time delay smaller than the first time delay.

40. The method of claim 39, wherein producing a second signal includes:

applying a second delay to the first signal;

comparing the input signal and the feedback signal to produce second shifting signals; and adjusting the second delay based on the second shifting signals.

41. The method of claim 40 further comprising:

delaying the second signal to produce the feedback signal.

42. A method for synchronizing signals, the method comprising:

applying a first amount of delay, using a delay line, to an input signal using a plurality of delay cells of a coarse loop to produce a first delayed signal, each of the delay cell having identical delay elements;

applying a second amount of delay to the first delayed signal at a fine loop to produce an output signal;

delaying the output signal to produce a feedback signal;

comparing the feedback signal and the input signal; and adjusting the first amount of delay and the second amount of delay wherein adjusting the first amount of delay is performed by a shift register, the shift register including a number of register cells, each connecting to multiple delay cells of the delay line.

43. The method of claim 42, wherein adjusting the second amount of delay is performed by a another shift register.

44. The method of claim 42, wherein applying the first amount of delay including applying an amount of delay in a first delay range.

45. The method of claim 42, wherein applying the second amount of delay including applying an amount of delay in a second delay range smaller than the first delay range.

46. A method of operating a memory device comprising:

accessing a memory cell to obtain a data signal;

propagating the data signal from the memory cell to an output circuit;

applying a delayed signal to activate the output circuit, wherein applying a delayed signal includes propagating a clock signal through a delay circuit including a coarse loop and a fine loop controlled by a shift register, the coarse loop having a first delay range, the fine loop having a second delay range smaller than the first delay range, the coarse loop including a plurality of delay cells, each having identical delay elements, the shift register including a plurality of register cells, each connecting to two delay cells;

producing a strobe signal from the delayed signal;

propagating the data signal from the output circuit to an output pad; and adjusting the delayed signal at the delay circuit to synchronize the strobe signal and the data signal at the output pad.

47. A method of synchronizing signals, the method comprising:

initiating a read operation;

reading a memory cell to obtain a data signal at an output circuit;

providing a delayed signal to the output circuit to using a delay circuit including a coarse loop and a fine loop controlled by a shift register, the coarse loop having a first delay range, the fine loop having a second delay range smaller than the first delay range, the coarse loop including a plurality of delay cells, each having identical delay elements, the shift register including a plurality of register cells, each connecting to two delay cells; and producing a strobe signal synchronized with the data signal using the delay circuit.

* * * * *

UNITED STATES PATENT AND TRADEMARK OFFICE
CERTIFICATE OF CORRECTION

PATENT NO.     : 6,774,690 B2
DATED          : August 10, 2004
INVENTOR(S)    : Baker et al.

It is certified that error appears in the above-identified patent and that said Letters Patent is hereby corrected as shown below:

Column 8,
Line 23, delete "ins" and insert -- 1ns --, therefor.

Column 12,
Line 7, after "comprising" delete ";" and insert -- : --, therefor.

Column 15,
Line 5, after "by" delete "a".

Signed and Sealed this

Eighth Day of February, 2005

JON W. DUDAS
*Director of the United States Patent and Trademark Office*